(12) United States Patent
Markov et al.

(10) Patent No.: US 11,769,558 B2
(45) Date of Patent: Sep. 26, 2023

(54) METHOD OF REDUCING RANDOM TELEGRAPH NOISE IN NON-VOLATILE MEMORY BY GROUPING AND SCREENING MEMORY CELLS

(71) Applicant: Silicon Storage Technology, Inc., San Jose, CA (US)

(72) Inventors: Viktor Markov, Santa Clara, CA (US); Alexander Kotov, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 216 days.

(21) Appl. No.: 17/482,095

(22) Filed: Sep. 22, 2021

(65) Prior Publication Data

US 2022/0392549 A1 Dec. 8, 2022

Related U.S. Application Data

(60) Provisional application No. 63/208,093, filed on Jun. 8, 2021.

(51) Int. Cl.
*G11C 16/34* (2006.01)
*G11C 16/10* (2006.01)
*G11C 16/26* (2006.01)
*G11C 16/14* (2006.01)

(52) U.S. Cl.
CPC ......... *G11C 16/3427* (2013.01); *G11C 16/10* (2013.01); *G11C 16/14* (2013.01); *G11C 16/26* (2013.01); *G11C 2216/04* (2013.01)

(58) Field of Classification Search
CPC .................................................. G11C 16/34
USPC .................................................. 365/185.22
See application file for complete search history.

(56) References Cited

U.S. PATENT DOCUMENTS

| 5,029,130 | A | 7/1991 | Yeh |
| 6,747,310 | B2 | 6/2004 | Fan et al. |
| 6,855,980 | B2 | 2/2005 | Wang et al. |
| 7,315,056 | B2 | 1/2008 | Klinger |

(Continued)

FOREIGN PATENT DOCUMENTS

JP 2003187588 7/2003

OTHER PUBLICATIONS

PCT Search Report and Written Opinion dated Feb. 22, 2022 corresponding to PCT Patent Application No. US 2021/052249.

(Continued)

*Primary Examiner* — Jason Lappas
(74) *Attorney, Agent, or Firm* — DLA Piper LLP (US)

(57) ABSTRACT

A method of programing a memory device having a plurality of memory cell groups where each of the memory cell group includes N non-volatile memory cells, where N is an integer greater than or equal to 2. For each memory cell group, the method includes programming each of the non-volatile memory cells in the memory cell group to a particular program state, performing multiple read operations on each of the non-volatile memory cells in the memory cell group, identifying one of the non-volatile memory cells in the memory cell group that exhibits a lowest read variance during the multiple read operations, deeply programming all of the non-volatile memory cells in the memory cell group except the identified non-volatile memory cell, and programming the identified non-volatile memory cell in the memory cell group with user data.

10 Claims, 4 Drawing Sheets

(56) References Cited

U.S. PATENT DOCUMENTS

| | | | |
|---|---|---|---|
| 7,868,375 | B2 | 1/2011 | Liu et al. |
| 8,711,636 | B2 | 4/2014 | Do et al. |
| 2002/0036925 | A1 | 3/2002 | Tanzawa |
| 2005/0083735 | A1 | 4/2005 | Chen et al. |
| 2010/0259979 | A1 | 10/2010 | Jia |
| 2012/0113714 | A1 | 5/2012 | Choy |
| 2014/0082440 | A1 | 3/2014 | Ho |
| 2016/0077912 | A1 | 3/2016 | Mateescu |
| 2016/0293271 | A1 | 10/2016 | Won |
| 2017/0206981 | A1 | 7/2017 | Nafziger |
| 2019/0139602 | A1 | 5/2019 | Tiwari |
| 2019/0164617 | A1* | 5/2019 | Tran ................ G11C 11/54 |
| 2020/0065023 | A1 | 2/2020 | Markov et al. |
| 2021/0065837 | A1 | 3/2021 | Markov et al. |

OTHER PUBLICATIONS

Taiwanese Office Action dated May 11, 2023 corresponding to the related Taiwanese Patent Application No. 111117773.
*Negative bias temperature instability: What do we understand?* By Dieter K. Schroder, in Microelectronics Reliability 47 (2007) 841-852, Department of Electrical Engineering and Center for Solid State Electronics Research, Arizona State University, Tempe, AZ 85287-5706, USA.

* cited by examiner

METHOD OF REDUCING RANDOM TELEGRAPH NOISE IN NON-VOLATILE MEMORY BY GROUPING AND SCREENING MEMORY CELLS

RELATED APPLICATIONS

This application claims the benefit of U.S. Provisional Application No. 63/208,093, filed Jun. 8, 2021, and which is incorporated herein by reference.

FIELD OF THE INVENTION

The present invention relates to non-volatile memory devices, and more particularly to improving the stability of memory cell current during read operations.

BACKGROUND OF THE INVENTION

Non-volatile memory devices are well known in the art. See for example U.S. Pat. No. 7,868,375, which discloses a four-gate memory cell configuration, and which is incorporated herein by reference for all purposes. Specifically, FIG. 1 of the present application illustrates a split gate memory cell 10 with spaced apart source and drain regions 14/16 formed in a silicon semiconductor substrate 12. The source region 14 can be referred to as a source line SL (because it commonly is connected to other source regions for other memory cells in the same row or column), and the drain region 16 is commonly connected to a bit line by a bit line contact 28. A channel region 18 of the substrate is defined between the source/drain regions 14/16. A floating gate 20 is disposed vertically over and insulated from (and controls the conductivity of) a first portion of the channel region 18 (and partially vertically over and insulated from the source region 14). A control gate 22 is disposed vertically over and insulated from the floating gate 20. A select gate 24 is disposed vertically over and insulated from (and controls the conductivity of) a second portion of the channel region 18. An erase gate 26 is disposed vertically over and insulated from the source region 14 and is laterally adjacent to the floating gate 20. A plurality of such memory cells can be arranged in rows and columns to form a memory cell array.

Various combinations of voltages are applied to the control gate 22, select gate 24, erase gate 26 and/or source and drain regions 14/16, to program the split gate memory cell 10 (i.e., inject electrons onto the floating gate), to erase the split gate memory cell 10 (i.e., remove electrons from the floating gate), and to read the split gate memory cell 10 (i.e., measure or detect the conductivity of the channel region 18 to determine the programming state of the floating gate 20).

Split gate memory cell 10 can be operated in a digital manner, where the split gate memory cell 10 is set to one of only two possible states: a programmed state and an erased state. The split gate memory cell 10 is erased by placing a high positive voltage on the erase gate 26, and optionally a negative voltage on the control gate 22, to induce tunneling of electrons from the floating gate 20 to the erase gate 26 (leaving the floating gate 20 in a more positively charged state—the erased state). Split gate memory cell 10 can be programmed by placing positive voltages on the control gate 22, erase gate 26, select gate 24 and source region 14, and a current on drain region 16. Electrons will then flow along the channel region 18 from the drain region 16 toward the source region 14, with electrons becoming accelerated and heated whereby some of them are injected onto the floating gate 20 by hot-electron injection (leaving the floating gate 20 in a more negatively charged state—the programmed state). Split gate memory cell 10 can be read by placing positive voltages on the select gate 24 (turning on the portion of channel region 18 under the select gate 24) and drain region 16 (and optionally on the erase gate 26 and/or the control gate 22), and sensing current flow through the channel region 18. If the floating gate 20 is positively charged (i.e. split gate memory cell 10 is erased), the split gate memory cell 10 will turn on, and electrical current will flow from drain region 16 to source region 14 (i.e. the split gate memory cell 10 is sensed to be in its erased "1" state based on sensed current flow). If the floating gate 20 is negatively charged (i.e. split gate memory cell 10 is programmed), the portion of channel region 18 under the floating gate 20 is turned off, thereby preventing appreciable current flow (i.e., the split gate memory cell 10 is sensed to be in its programmed "0" state based on no, or minimal, current flow).

Table 1 provides non-limiting examples of erase, program and read voltages for typical digital operation of the split gate memory cell, where Vcc is power supply voltage or another positive voltage such as 2.5 V.

TABLE 1

|         | WL (SG) | BL (Drain) | Source | EG     | CG     |
|---------|---------|------------|--------|--------|--------|
| Erase   | 0 V     | 0 V        | 0 V    | 11.5 V | 0 V    |
| Program | 1 V     | 1 µA       | 4.5 V  | 4.5 V  | 10.5 V |
| Read    | Vcc     | 0.6 V      | 0 V    | 0 V    | Vcc    |

Split gate memory cell 10 can alternately be operated in an analog manner where the memory state (i.e. the amount of charge, such as the number of electrons, on the floating gate 20) of the split gate memory cell 10 can be tuned to anywhere from a fully erased state (minimum number of electrons on the floating gate 20) to a fully programmed state (maximum number of electrons on the floating gate 20), or just to a portion of this range by varying one or several programming voltages, for example, one can use various control gate 22 (CG) programming voltages for analog programming. This means the split gate memory cell 10 storage is analog, which allows for very precise and individual tuning of each split gate memory cell 10 in the array of split gate memory cells 10. Alternatively, the split gate memory cell 10 could be operated as an MLC (multilevel cell) where it is configured to be programmed to one of many discrete values (such as 16 or 64 different values). In the case of analog or MLC programming, the programming voltages are applied for a limited time, or as a series of pulses, until the desired programming state is achieved. In the case of multiple programming pulses, intervening read operations between programming pulses can be used to determine if the desired programming state has been achieved (in which case programming ceases) or has not been achieved (in which case programming continues).

Split gate memory cell 10 operated in an analog manner or as an MLC may be more sensitive to noise and read current instabilities which can adversely affect the accuracy of the split gate memory cell 10. One source of read current instability in analog non-volatile memory devices is the capture and emission of electrons by oxide traps located at the interface and near-interface between the gate oxide and memory cell channel region. The gate oxide is the insulation layer that separates the floating gate 20 from the channel region 18 of substrate 12. When an electron is captured on an interface trap, it reduces the channel conductivity during a read operation, and thus increases the threshold voltage Vt of the split gate memory cell 10 (i.e., the minimum voltage on the control gate 22 needed to turn on the channel region 18 of the split gate memory cell 10 to produce a predetermined target current, 1 µA being an example). When the control gate voltage is at or above the threshold voltage Vt, a conducting path is created between the source region 14 and the drain region 16, and a current of at least the predetermined target current flows. When the control gate voltage is below the threshold voltage Vt, a conducting path is not created, and any current between the source region 14 and the drain region 16 is considered sub-threshold or leakage current. An electron captured on an interface trap can be emitted from the interface trap, which decreases threshold voltage Vt of the memory cell, and thus increases the channel conductivity during a read operation. These single-electron events of electron capture and emission by interface traps appear as read current noise and are referred to as random telegraph noise (RTN). In general, RTN produced by a single interface trap is characterized by two states: a lower Vt state (and higher read current state) when an electron is emitted from the interface trap and a higher Vt state (and lower read current state) when an electron is captured by the interface trap. As described above, the instability of the split gate memory cell 10 during read can be characterized either by the threshold voltage Vt, i.e. the control gate voltage corresponding to the predetermined target current or by memory cell current under given read voltage conditions. The present examples are particularly described in relation to memory cell read instability as threshold voltage Vt, however the use of memory cell current under given read voltages are specifically contemplated.

There is a small but not insignificant percentage of memory cells, such as split gate memory cells 10, within an array of memory cells, that exhibit intolerable amounts of RTN for those applications where very high read accuracy is required. Memory cells that are prone to RTN increase the risk that some analog data stored in the array of memory cells will be corrupted at least to some extent, because electron emission from the interface trap by such memory cells after programing will undesirably decrease the threshold voltage Vt of the memory cell (and therefore undesirably increase channel conductivity during a read operation), thus providing an inaccurate read of the desired original memory cell program state. Similarly, electron capture by such memory cells after programing will undesirably increase the threshold voltage Vt of the memory cell (and therefore undesirably decrease channel conductivity during a read operation), thus providing an inaccurate read of the desired original memory cell program state. Therefore, there is a need to address RTN in analog and MLC non-volatile memory devices to compensate for post-program RTN.

BRIEF SUMMARY OF THE INVENTION

The aforementioned problems and needs are addressed by a memory device that includes a plurality of memory cell groups, where each of the memory cell groups includes N non-volatile memory cells, where N is an integer greater than or equal to 2; and a control circuitry. The control circuitry is configured to, for each of the memory cell groups, program each of the non-volatile memory cells in the memory cell group to a particular program state, perform multiple read operations on each of the non-volatile memory cells in the memory cell group, identify one of the non-volatile memory cells in the memory cell group that exhibits a lowest read variance during the multiple read operations, deeply program all of the non-volatile memory cells in the memory cell group except the identified non-volatile memory cell, and program the identified non-volatile memory cell in the memory cell group with user data.

A method of programing a memory device having a plurality of memory cell groups where each of the memory cell group includes N non-volatile memory cells, where N is an integer greater than or equal to 2, wherein for each memory cell group, the method comprises programming each of the non-volatile memory cells in the memory cell group to a particular program state, performing multiple read operations on each of the non-volatile memory cells in the memory cell group, identifying one of the non-volatile memory cells in the memory cell group that exhibits a lowest read variance during the multiple read operations, deeply programming all of the non-volatile memory cells in the memory cell group except the identified non-volatile memory cell, and programming the identified non-volatile memory cell in the memory cell group with user data.

Other objects and features will become apparent by a review of the specification, claims and appended figures.

DETAILED DESCRIPTION OF THE INVENTION

Figure 1:
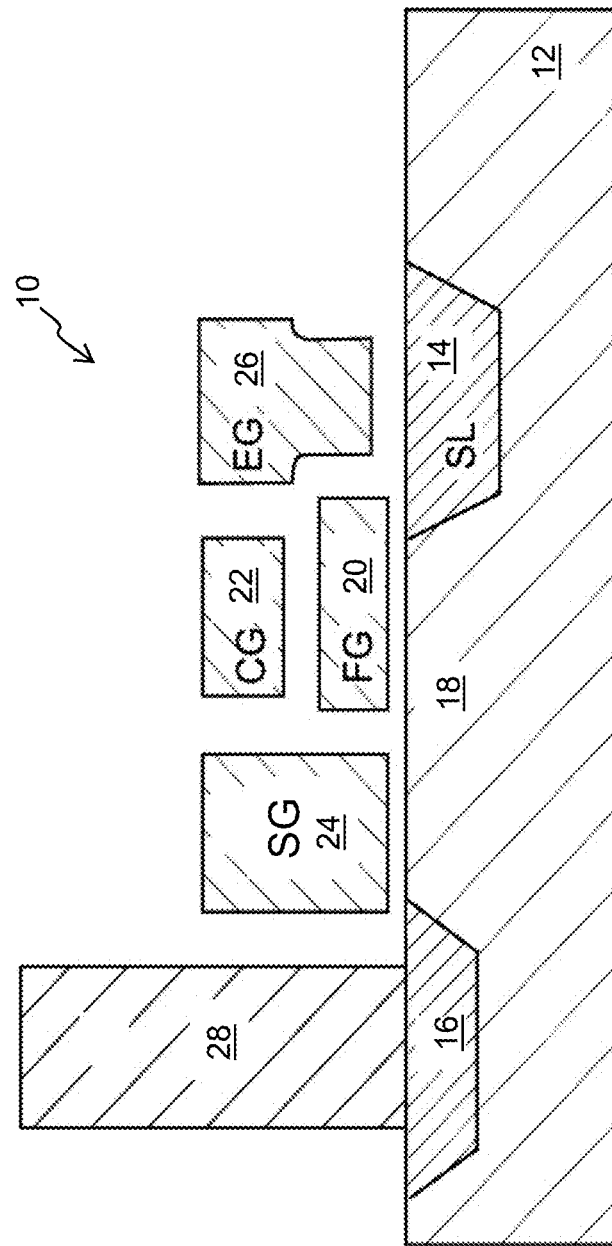
FIG. 1 is a side cross sectional view of a conventional memory cell.

The present example(s) technique for reducing the effects of RTN for arrays of non-volatile memory cells, particularly those that include split gate memory cells 10 of the type of FIG. 1, although the techniques are not limited to such memory cells. Specifically, the non-volatile memory cells are logically divided into memory cell groups, each memory cell group comprising two or more memory cells, where each memory cell group is treated as a single cell for storing user data. Within each memory cell group, only the non-volatile memory cell exhibiting the lowest RTN is used to store user data, while the rest of the non-volatile memory cells of the memory cell group are deeply programmed to effectively screen them out, i.e. so that they do not contribute to the output of the memory cell group during subsequent read operations.

Figure 2:
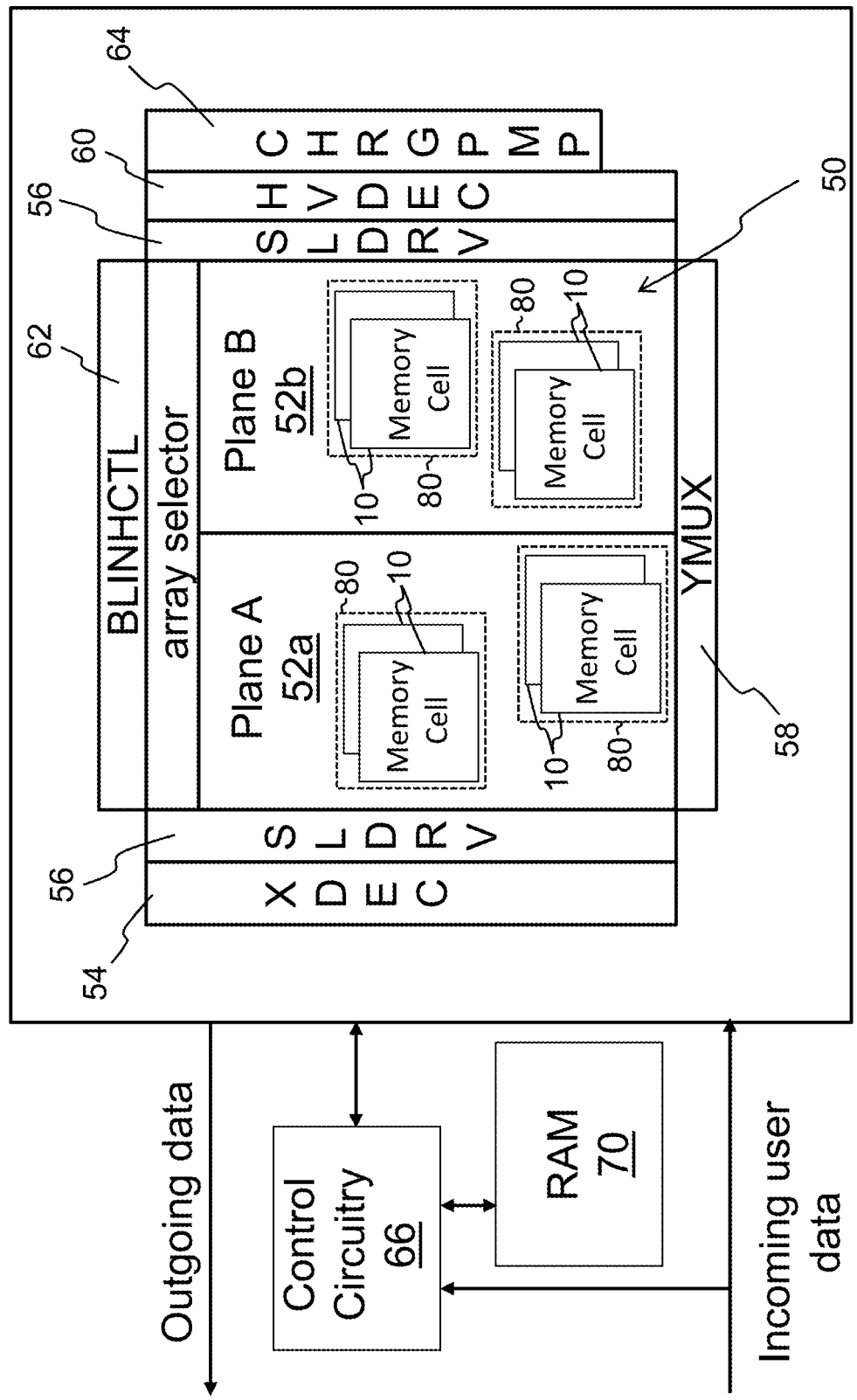
FIG. 2 is a diagram illustrating the components of a memory device.

The memory cell grouping, screening and programming are implemented as part of the configuration of the control circuitry 66, which controls the various device elements of the memory array, which can be better understood from the architecture of an example memory device as illustrated in FIG. 2. The memory device includes an array 50 of the split gate memory cells 10, which can be segregated into two separate planes (Plane A 52a and Plane B 52b). The split gate memory cells 10 can be of the type shown in FIG. 1, arranged in a plurality of rows and columns in the semiconductor substrate 12, and thus formed on a single chip. Adjacent to the array 50 of split gate memory cells 10, and included in the memory device, are an address decoder (e.g. XDEC 54), source line drivers (e.g. SLDRV 56), a column decoder (e.g. YMUX 58), a high voltage row decoder (e.g.

HVDEC 60) and a bit line controller (e.g. BLINHCTL 62), which are used to decode addresses and supply the various voltages to the gates and regions of the split gate memory cells 10 during read, program, and erase operations for selected split gate memory cells 10 of the array 50. Column decoder 58 includes a sense amplifier containing circuitry for measuring the currents on the bit lines during a read operation. Control circuitry 66 is configured to control the various device elements to implement each operation (program, erase, read) on selected split gate memory cells 10 of the array 50 as described herein. Charge pump CHRGPMP 64 provides the various voltages used to read, program and erase the selected split gate memory cells 10 of the array 50 under the control of control circuitry 66. The control circuitry 66 is configured to operate the memory device to program, erase and read the selected split gate memory cells 10 of the array 50. As part of these operations, the control circuitry 66 can be provided with access to the incoming user data which is data to be programmed to the memory cells, along with program, erase and read commands provided on the same or different lines. Data read from the array 50, i.e. from selected split gate memory cells 10 of the array 50, is provided as outgoing data. The control circuitry 66 includes, or is provided access to, a separate memory such as random access memory (RAM) 70 for storing voltage values as described further below.

Control circuitry 66 implements the memory cell grouping, screening and programming described herein. Thus, control circuitry 66 may be loaded with software, i.e. non-transitory electronically readable instructions, or firmware, to perform the methods described below in relation to FIGS. 3-4, thereby being configured. Control circuitry 66 may be implemented by a microcontroller, dedicated circuitry, a processor, or a combination thereof.

In accordance with the examples herein, the split gate memory cells 10 of the array 50 are logically divided into memory cell groups 80 of N cells in each memory cell group 80, where N is an integer greater than or equal to two. FIG. 2 illustrates four memory cell groups 80 each having two memory cells 10 (i.e., N=2), however the number of memory cell groups 80 and the value of N can be different.

Before describing the grouping and screening of memory cells, the basics of memory cell programming is described first.

Memory cell programming involves programming the memory cell to a particular programming state using programming voltage pulses, with intervening read operations to measure a threshold voltage parameter (i.e., a minimum voltage applied to the split gate memory cell 10 to achieve a predetermined level of source/drain current, referred to as a target current $I_{target}$) for the split gate memory cell 10. The threshold voltage parameter is a control gate threshold voltage Vtcg, which is the threshold voltage of the memory cell as viewed from the control gate 22. Specifically, the control gate threshold voltage Vtcg is the voltage placed on the control gate 22 that results in the channel region 18 being a conducting path, and therefore results in a read current through the channel of the predetermined level of source/drain current, i.e., the target current $I_{target}$ (e.g., 1 µA) to consider the split gate memory cell 10 turned on when the read potentials of a read operation are applied to the select gate 24 and drain region 16. The control gate threshold voltage Vtcg varies as a function of programming state of the split gate memory cell 10, but it is desired that once the split gate memory cell 10 is programmed to a particular programming state, any variation of control gate threshold voltage Vtcg over time be below a predetermined amount.

Figure 3:
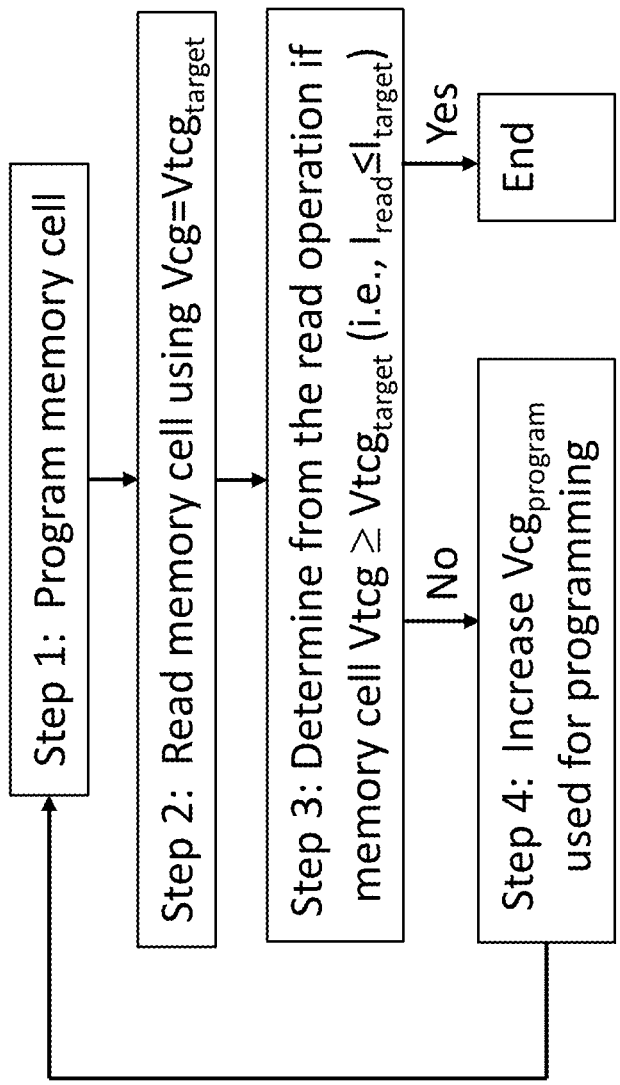
FIG. 3 is a flow diagram showing steps for programming memory cells.
Figure 4:
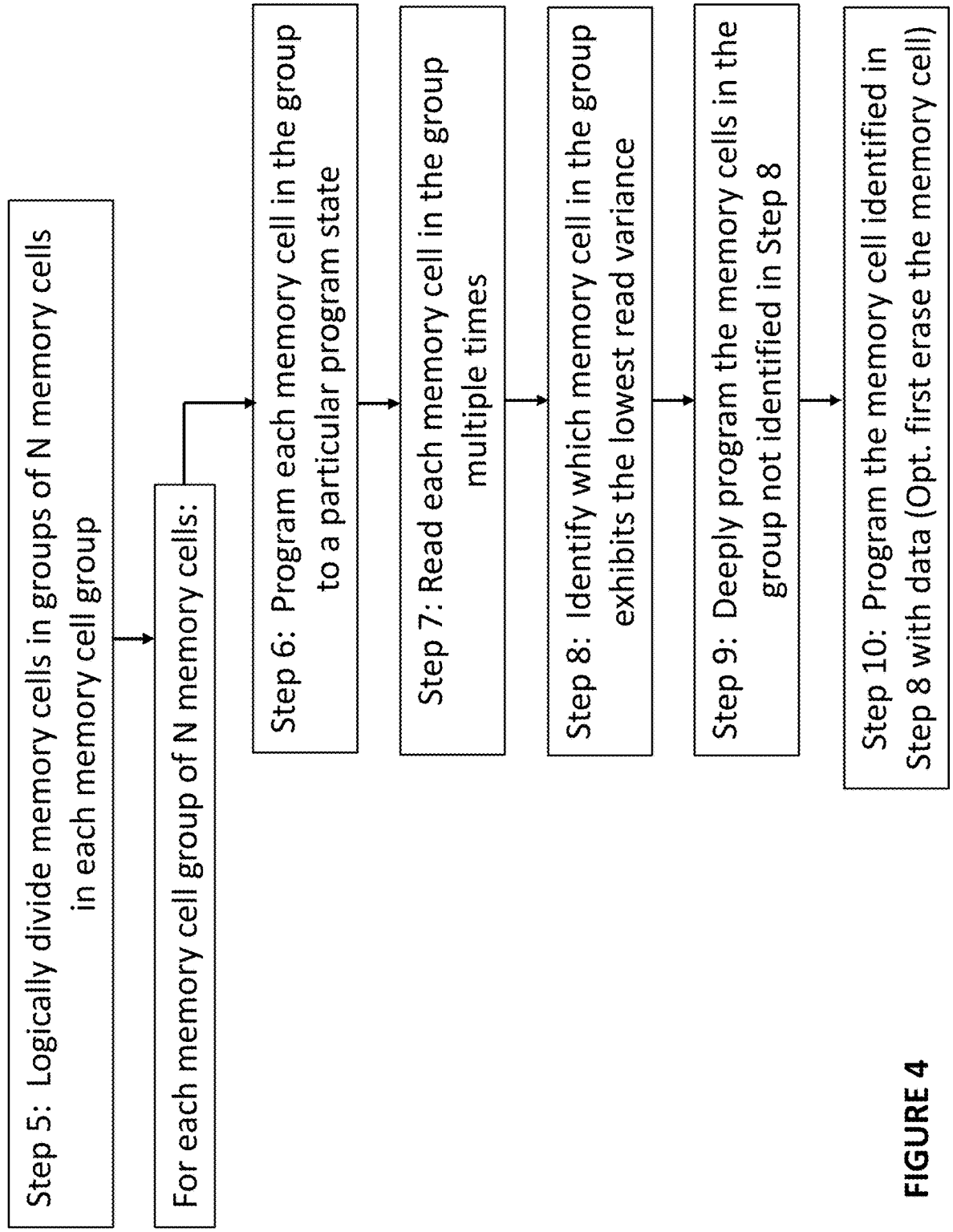
FIG. 4 is a flow diagram showing steps for grouping, screening and programing the memory cells.

Memory cell programming is illustrated as Steps 1-4 in FIG. 3, which is implemented to program a split gate memory cell 10 to a specific desired programming state so that it has a target control gate threshold voltage $Vtcg_{target}$ that is associated with that specific desired programming state. The technique begins in Step 1 with control circuitry 66 programming a selected split gate memory cell 10 of array 50. As described above, the analog programming operation involves applying programming voltages to the selected split gate memory cell 10 for a limited time (i.e., in at least one pulse), which results in injecting electrons onto the floating gate 20. In the programming of Step 1, the voltage Vcg, provided from SLDRV 56, applied to the control gate 22 has a control gate program voltage $Vcg_{program}$. In Step 2, a read operation is performed by control circuitry 66 which involves applying read voltages from SLDRV 56 to the selected split gate memory cell 10, according to Table 1, and measuring, with column decoder 58 and bit line controller 62, the current flowing through the channel region 18 of the selected split gate memory cell 10, $I_{read}$. In this read operation, the voltage Vcg applied to the control gate 22 is the target control gate threshold voltage $Vtcg_{target}$. In Step 3, it is determined from the read operation of Step 2 whether or not the control gate threshold voltage Vtcg of the memory cell has reached or exceeded the target control gate threshold voltage $Vtcg_{target}$ (i.e., whether the read current $I_{read}$ measured by column decoder 58 and bit line controller 62 is less than or equal to the target current $I_{target}$, where $I_{read}$ equal to the target current $I_{target}$ is indicative of the control gate threshold voltage Vtcg of the memory cell reaching the target control gate threshold voltage $Vtcg_{target}$). If the determination is no (i.e., that the control gate threshold voltage Vtcg is not greater than or equal to the target control gate threshold voltage $Vtcg_{target}$ i.e., that the read current $I_{read}$ is not less than or equal to the target current $I_{target}$), then in Step 4 the control gate program voltage $Vcg_{program}$ used for programming is increased relative to that used in the previous Step 1 programming of the memory cell, and then Step 1 is repeated using the increased control gate program voltage $Vcg_{program}$. Thus, in a first iteration of Step 1, a first program voltage is applied to the gate of the memory cell, and in a second iteration of Step 1, responsive to Step 4, a second program voltage is applied to the gate of the memory cell, where the second program voltage is greater than the first program voltage. Steps 1-4 are repeated, in order, by control circuitry 66, until it is determined in Step 3 that the control gate threshold voltage Vtcg of the memory cell has reached or exceeded the target control gate threshold voltage $Vtcg_{target}$ (i.e., that the read current $I_{read}$ is less than or equal to the target current $I_{target}$). At that point, the memory cell is considered programmed to its desired programming state (i.e. to its target control gate threshold voltage $Vtcg_{target}$).

However, if the programmed memory cell exhibits RTN after programming is completed, then electron(s) captured on interface trap(s) contribute to the measured control gate threshold voltage Vtcg of the memory cell. If/when the electron(s) are emitted from the interface trap(s) after programming is completed, then the control gate threshold voltage Vtcg could drop by more than $\Delta Vtcg_{max}$ below the target control gate threshold voltage $Vtcg_{target}$, where $\Delta Vtcg_{max}$ is the maximum tolerable read error in terms of control gate threshold voltage Vtcg variation. A control gate threshold voltage drop by more than $\Delta Vtcg_{max}$ is considered to be an intolerable error during subsequent read operations. Similarly, if/when the electron(s) are captured on the interface trap(s) after programming is completed, then the control gate threshold voltage Vtcg could increase by more than $\Delta Vtcg_{max}$ above the target control gate threshold voltage $Vtcg_{target}$. A control gate threshold voltage increase by more than $\Delta Vtcg_{max}$ is considered to be an intolerable error during subsequent read operations. The cells with intolerable error behavior can be assigned for screening. Therefore, memory cell grouping and screening is performed beginning with Step 5 in FIG. 4. In Step 5, the split gate memory cells 10 of array 50 are logically divided into memory cell groups 80 of N cells in each memory cell group 80, where N is an integer greater than or equal to two. The N split gate memory cells 10 in each memory cell group 80 can be adjacent to each other in the same column, or adjacent to each other in the same row, or not be adjacent to each other.

For each memory cell group 80, the N memory split gate memory cells 10 of the memory cell group 80 are programmed to a particular program state (Step 6), i.e. as described above in relation to Steps 1-4. Thus, steps 1-4 may be performed before, or after, step 5, without limitation. In step 7, the N split gate memory cells 10 of the memory cell group 80 are each read multiple times. In Step 8, the split gate memory cell 10 in the memory cell group 80 with the lowest read variance is identified. Read variance for each split gate memory cell 10 can be variations in read current $I_{read}$ and/or variations in control gate threshold voltage Vtcg exhibited between the multiple read operations performed on the split gate memory cell 10 in Step 7. It is the split gate memory cell 10 in the memory cell group 80 with the lowest variation in $I_{read}$ and/or in Vtcg that is identified in Step 8.

In step 9, the split gate memory cells 10 in the memory cell group 80 not identified in Step 8, i.e. all of the other split gate memory cells in the memory cell group 80, are deeply programmed (i.e., programmed with a high number of electrons, well beyond the chosen MLC or analog operating range for storing user data, so that these deeply programmed split gate memory cells 10 do not contribute to any detected current from the memory cell group 80 (or any other memory cell group 80) during subsequent read operations of the split gate memory cell 10 in the memory cell group 80 (or in any other memory cell group 80) that is used to store user data, because the deeply programmed state of the floating gate with the high number of electrons effectively turns off the underlying channel region 18 and prevents current flow). Those skilled in the art will recognize that the operating range and the number of rows in the array 50 which contribute to read current differ from product to product. As a result, a specific value for deep programming is implementation dependent. The larger the number of memory cells 10 per row, the lower $I_{read}$ should be for deeply programmed memory cells 10, to prevent their combined contribution to an overall read current for the row. In one example, deep programming of memory cells 10 that are to be screened out is performed rapidly, i.e. by one programming pulse and without verification, to save time, and programming voltages for deep screening will be the same for all screened cell memory cells 10.

In Step 10, the one split gate memory cell 10 identified in Step 8 is programmed with user data (e.g., as described above with respect to FIG. 3). Step 10 may require first erasing the one split gate memory cell 10 identified in Step 8 prior to programing it with user data. Steps 6-10 are performed for each of the memory cell groups 80 in the array to be programmed with user data.

In order to read the data from each of the memory cell groups 80, all split gate memory cells 10 in the memory cell group 80 are selected, but only the split gate memory cell 10 identified in Step 8 and programmed in Step 10 for that memory cell group 80 contributes to read current in a data read operation. The other split gate memory cells 10 in the memory cell group 80 do not contribute current to the read operation because they are deeply programmed. As such, only the split gate memory cell 10 in the memory cell group 80 identified to have the lowest read variance, and thus the lowest RTN, is used to store user data and to provide the data in any read operations. The other split gate memory cells 10 in the memory cell group 80 are effectively screened out, thus suppressing any RTN that might otherwise result if the split gate memory cells 10 in the memory cell group 80 exhibiting higher read variances were used to store user data and/or contribute to the data read operation. The above described memory cell grouping and screening reduces the effect of RTN on analog program and reading accuracy.

The above described technique has many advantages. First, it effectively screens out the split gate memory cells 10 exhibiting greater RTN. Second, it avoids having to screen out all the split gate memory cells 10 in a given column or row simply because a single noisy split gate memory cell 10 is found in the column or row (i.e., by replacing the column or row with a redundancy column or row as is known in the prior art where redundant (spare) rows and/or columns are provided and utilized to replace any row or column that contains a noisy memory cell). Third, while screening out all but one split gate memory cell 10 in each memory cell group 80 reduces the effective density of usable memory cells in the array, that density reduction can be partially or even completely compensated for by the improved accuracy of the analog programming for the less noisy split gate memory cells 10 and thus an ability to allocate more possible program levels of read current $I_{read}$ (or control gate threshold voltage Vtcg) for a given operation range. For example, if N=2 (i.e., two memory cells in each memory cell group), if the improved programming accuracy allows for twice as many possible program states for the one split gate memory cell 10 characterized by lower RTN, then twice as many bits can be programmed using the one split gate memory cell 10, thus providing the same memory density as a memory array using all the split gate memory cells 10 at half the possible program states per split gate memory cell 10. Therefore, using twice as many program states per split gate memory cell 10 compared to a conventional array results in better read-out stability and reliability over time due to reduced RTN across the memory array.

It is to be understood that the above is not limited to the example(s) described above and illustrated herein but encompasses any and all variations falling within the scope of any claims. For example, references to the invention or example(s) herein are not intended to limit the scope of any claim or claim term, but instead merely relate to one or more features that may be covered by one or more of the claims. Materials, processes and numerical examples described above are exemplary only, and should not be deemed to limit the claims. Further, as is apparent from any claims and the specification, not all method steps need be performed in the exact order illustrated or claimed unless specified. The example of threshold voltage Vt used in the above described techniques is control gate threshold voltage Vtcg, which is the threshold voltage of the split gate memory cell 10 as viewed from the control gate 22. However, the above described techniques could be implemented with respect to threshold voltage Vt as viewed from any one or more gates in the split gate memory cell 10 that is not floating. Finally, the example(s) herein could be implemented in an array of non-volatile memory cells with fewer gates than those in FIG. 1 (e.g., no erase gate and/or control gate combined with select gate).

What is claimed is:

1. A memory device, comprising:
a plurality of memory cell groups, where each of the memory cell groups includes N non-volatile memory cells, where N is an integer greater than or equal to 2; and
a control circuitry that is configured to, for each of the memory cell groups:
program each of the non-volatile memory cells in the memory cell group to a particular program state,
perform multiple read operations on each of the non-volatile memory cells in the memory cell group,
identify one of the non-volatile memory cells in the memory cell group that exhibits a lowest read variance during the multiple read operations,
deeply program all of the non-volatile memory cells in the memory cell group except the identified non-volatile memory cell, and
program the identified non-volatile memory cell in the memory cell group with user data.

2. The memory device of claim 1, wherein the control circuitry is further configured to, for each of the memory cell groups:
erase the identified non-volatile memory cell in the memory cell group before the programming of the identified non-volatile memory cell in the memory cell group with the user data.

3. The memory device of claim 1, wherein each of the non-volatile memory cells of the plurality of memory cell groups comprises:
spaced apart source and drain regions formed in a semiconductor substrate, with a channel region of the substrate extending there between;
a floating gate disposed vertically over and insulated from a first portion of the channel region;
a select gate disposed vertically over and insulated from a second portion of the channel region; and
a control gate disposed vertically over and insulated from the floating gate.

4. The memory device of claim 3, wherein each of the non-volatile memory cells of the plurality of memory cell groups further comprises:
an erase gate disposed over and insulated from the source region.

5. The memory device of claim 1, wherein for each of the memory cell groups, the control circuitry is configured to program each of the non-volatile memory cells in the memory cell group to the particular program state by:
apply a first pulse of programming voltages to the non-volatile memory cell;
read the non-volatile memory cell using a read voltage applied to a gate of the non-volatile memory cell that is equal to a target threshold voltage to generate a read current; and
apply a second pulse of programming voltages to the non-volatile memory cell in response to a determination that the read current is not less than or equal to a target read current;
wherein the first pulse of programming voltages includes a first program voltage applied to the gate of the non-volatile memory cell, and wherein the second pulse of programming voltages includes a second program voltage applied to the gate of the non-volatile memory cell that is greater than the first program voltage.

6. A method of programing a memory device that includes a plurality of memory cell groups where each of the memory cell group includes N non-volatile memory cells, where N is an integer greater than or equal to 2, wherein for each memory cell group, the method comprising:
programming each of the non-volatile memory cells in the memory cell group to a particular program state;
performing multiple read operations on each of the non-volatile memory cells in the memory cell group;
identifying one of the non-volatile memory cells in the memory cell group that exhibits a lowest read variance during the multiple read operations;
deeply programming all of the non-volatile memory cells in the memory cell group except the identified non-volatile memory cell; and
programming the identified non-volatile memory cell in the memory cell group with user data.

7. The method of claim 6, wherein for each of the memory cell groups, the method further comprising:
erasing the identified non-volatile memory cell in the memory cell group before the programming of the identified non-volatile memory cell in the memory cell group with the user data.

8. The method of claim 6, wherein each of the N non-volatile memory cells in the plurality of memory cell groups comprises:
spaced apart source and drain regions formed in a semiconductor substrate, with a channel region of the substrate extending there between;
a floating gate disposed vertically over and insulated from a first portion of the channel region;
a select gate disposed vertically over and insulated from a second portion of the channel region; and
a control gate disposed vertically over and insulated from the floating gate.

9. The method of claim 8, wherein each of the non-volatile memory cells further comprises:
an erase gate disposed over and insulated from the source region.

10. The method of claim 6, wherein the programming of each of the non-volatile memory cells in the memory cell group to the particular program state comprises:
applying a first pulse of programming voltages to the non-volatile memory cell;
reading the non-volatile memory cell using a read voltage applied to a gate of the non-volatile memory cell that is equal to a target threshold voltage to generate a read current; and
applying a second pulse of programming voltages to the non-volatile memory cell in response to determining that the read current is greater than a target read current;
wherein the first pulse of programming voltages includes a first program voltage applied to the gate of the non-volatile memory cell, and wherein the second pulse of programming voltages includes a second program voltage applied to the gate of the non-volatile memory cell that is greater than the first program voltage.

* * * * *